(12) United States Patent  
Murakami et al.

(10) Patent No.: US 7,085,147 B2
(45) Date of Patent: Aug. 1, 2006

(54) SYSTEMS AND METHODS FOR PREVENTING MALFUNCTION OF CONTENT ADDRESSABLE MEMORY RESULTING FROM CONCURRENT WRITE AND LOOKUP OPERATIONS

(75) Inventors: Hiroaki Murakami, Austin, TX (US); Hiromi Noro, Round Rock, TX (US); Osamu Takahashi, Round Rock, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 42 days.

(21) Appl. No.: 11/003,084

(22) Filed: Dec. 3, 2004

(65) Prior Publication Data

US 2006/0120127 A1  Jun. 8, 2006

(51) Int. Cl.
*G11C 15/00* (2006.01)

(52) U.S. Cl. .................... 365/49; 365/189.07; 365/233

(58) Field of Classification Search .................. 365/49, 365/189.09, 233
See application file for complete search history.

(56) References Cited

U.S. PATENT DOCUMENTS

| 6,307,767 | B1 | 10/2001 | Fuh |
| 6,584,003 | B1 | 6/2003 | Kim et al. |
| 6,646,899 | B1 | 11/2003 | Yiu et al. |
| 6,661,686 | B1 | 12/2003 | Srinivasan |
| 6,678,786 | B1* | 1/2004 | Srinivasan et al. .......... 711/108 |
| 6,751,720 | B1* | 6/2004 | Barroso et al. ............. 711/210 |

* cited by examiner

*Primary Examiner*—Hoai V. Ho
(74) *Attorney, Agent, or Firm*—Law Offices of Mark L Berrier

(57) ABSTRACT

Systems and methods for preventing the corruption of a CAM lookup result when a lookup in the CAM and a write to the CAM are concurrently executed. In one embodiment, a tag value is clocked into a tag latch simultaneously with a data value being clocked into a data latch. The tag value and initial CAM element values begin propagating through comparison logic. After a delay, the data value is written from the data latch to a CAM element. After the tag value and initial CAM values propagate through the comparison logic to produce comparison outputs, but before the newly written data value propagates through the comparison logic and changes the comparison outputs, the comparison outputs are latched. The comparison outputs can then be processed as if the data values in the CAM elements had not been changed by the write operation.

21 Claims, 9 Drawing Sheets

SYSTEMS AND METHODS FOR PREVENTING MALFUNCTION OF CONTENT ADDRESSABLE MEMORY RESULTING FROM CONCURRENT WRITE AND LOOKUP OPERATIONS

BACKGROUND

1. Field of the Invention

The invention relates generally to data storage systems, and more particularly to systems and methods for preventing lookup operations in a content addressable memory (CAM) from returning incorrect data as a result of concurrent write operations changing the data values stored in the CAM array.

2. Related Art

Data that is stored in a memory (e.g., RAM in a computer) is typically stored and retrieved based upon a particular address in the memory. In other words, a particular data value is stored at a specific address that defines a corresponding location in the memory. When the data value is needed, it is retrieved by reading the value from the address in the memory at which the data was previously stored. Thus, while the specific value of the stored data may not be known, the data can be easily accessed because the specific address at which the data was stored is known.

One alternative mechanism for storing data is a content addressable memory (CAM.) A CAM is a data storage structure which is designed so that data entries in the structure can be accessed by addressing the content of the memory locations, rather than the specific addresses of the memory locations. When a particular data value is stored in a CAM, the specific memory location in which the data is stored may not be known. The data can still be accessed, however, because at least a portion of the data itself is known, and the data can be located and accessed based upon this information. The known portion of the data is typically an identifier, or tag, which is appended to the data specifically for the purpose of being able to locate and access the data in the CAM.

CAMs may be useful in a variety of applications. For example, in networking systems in which packets of data are transmitted between multiple network nodes, packet data may be stored in a CAM. When it is necessary to retrieve the data for a particular packet, the data can be accessed using packet header information that functions as a tag for the data. In another example, commands and data transmitted between multiple master and slave devices in a multiprocessor computing system may be stored in a CAM with tag information that is appended to the information specifically for the purpose of enabling a receiving device to identify and retrieve the corresponding commands and/or data.

System designers may be faced, however, with various problems relating to the use of CAMs for storing data. Consider the example of a multiprocessor system in which a CAM is used to store commands and/or data. In this system, the various master and slave devices may issue commands that direct the execution of such actions as looking up an entry in a CAM, or writing a new entry to the CAM. Some of these commands may be issued at the same time. In particular, it is possible for the devices to issue simultaneous commands to look up a particular entry in a CAM and also to write to the same entry in the CAM. In this case, the lookup action may find the correct entry in the CAM, but the entry may be overwritten with new data before the desired data can be retrieved from the CAM. The lookup of the earlier data would therefore be corrupted.

It would therefore be desirable to provide a mechanism for ensuring that the data looked up in the CAM is successfully read out without interference from the subsequent data write to the same CAM entry.

SUMMARY OF THE INVENTION

One or more of the problems outlined above may be solved by the various embodiments of the invention. Broadly speaking, the invention includes systems and methods for systems and methods for preventing the corruption of a content addressable memory (CAM) lookup result when commands to perform a lookup in the CAM and to perform a write to the CAM are simultaneously executed. A static circuit is provided to clock the CAM lookup result into a latch before data that has been newly written into the CAM propagates through comparison circuitry and corrupts the lookup result.

In one embodiment, a tag value is clocked into a tag latch simultaneously with a data value being clocked into a data latch. The tag value and initial CAM element values begin propagating through comparison logic. After a delay, the data value is written from the data latch to a CAM element. After the tag value and initial CAM values propagate through the comparison logic to produce comparison outputs, but before the newly written data value propagates through the comparison logic and changes the comparison outputs, the comparison outputs are latched. The comparison outputs can then be processed as if the data values in the CAM elements had not been changed by the write operation.

One embodiment comprises a CAM system having an array of CAM elements, each of which stores a corresponding data entry. The system also has comparison logic which is coupled to the CAM elements. The comparison logic is configured to compare the data entries to a tag value and generate corresponding comparison output values. The comparison output values are provided to a comparison output latch which latches the values. When a lookup operation is performed concurrently with a write operation, the initial CAM element values and the tag value propagate through the comparison logic to produce the desired comparison output values. The values are latched by the comparison output latch before data written by the write operation propagates through the comparison logic and potentially causes the comparison output values to change.

Another embodiment comprises a method that includes comparing data values stored in an array of CAM elements to a tag value, generating comparison output values based on the data values in the CAM elements and the tag value, and latching the comparison output values. The comparison output values are latched before changes in the data values (resulting from a concurrent write operation) propagate to the comparison output values. In one embodiment, the In one embodiment, the comparison output values are latched concurrently with the new data being written from a data latch to the appropriate CAM element. The latched comparison output values may be provided to various types of circuits, such as an encoder, which may be either static or dynamic circuits. The system may be configured to read the data values in the CAM elements, as well as performing lookup and write operations. The system may also include invalidate logic which is configured to determine whether an invalidate bit associated with the data value to be written to the CAM is set, and to invalidate results of a lookup operation performed concurrently with the write operation if the invalidate bit is set.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
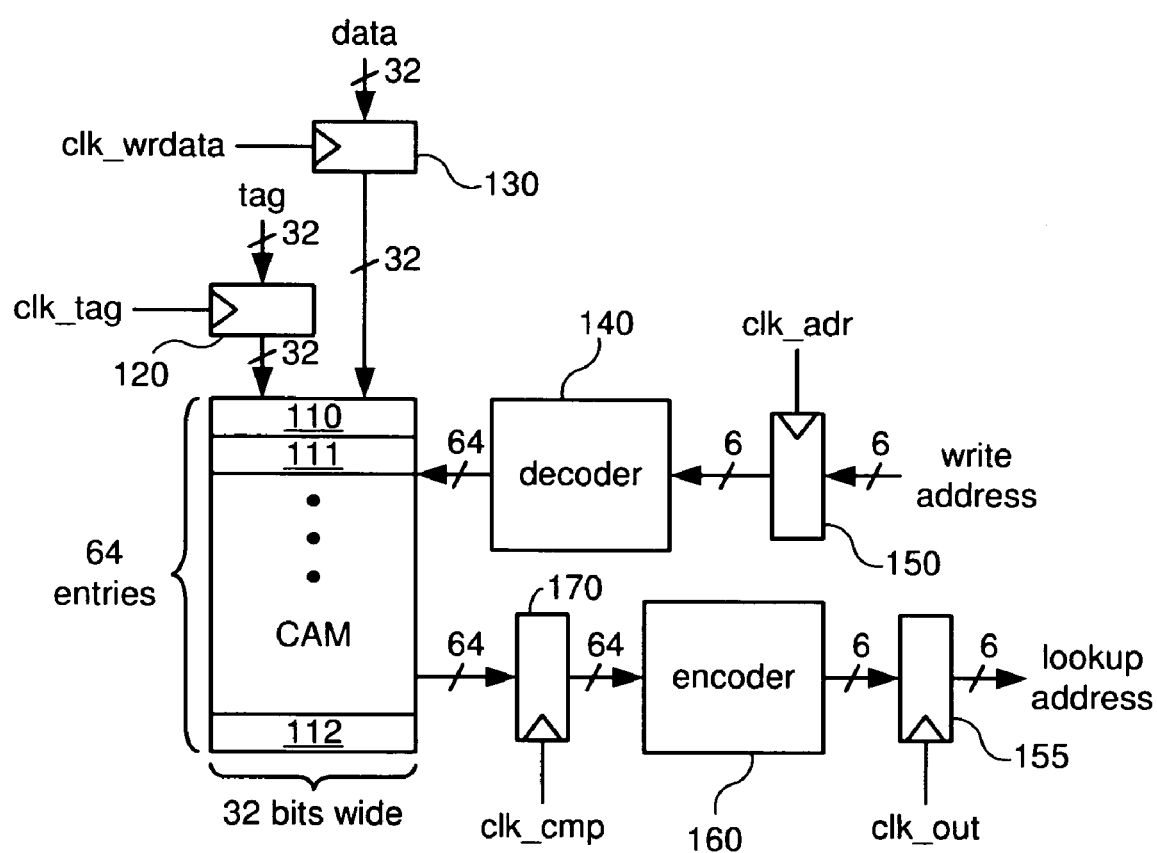
FIG. 1 is a diagram illustrating the overall structure of a content addressable memory (CAM) system in accordance with one embodiment.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for preventing lookup operations in a content addressable memory (CAM) from returning incorrect data as a result of concurrent write operations changing the data values stored in the CAM array.

In one embodiment, a mechanism is provided in a CAM system to prevent the corruption of a lookup result corresponding to a lookup command that is executed concurrently with a write command. The CAM system includes a set of CAM elements (a CAM array) into which data can be stored. The data includes a tag portion that is used to identify the data stored in a particular CAM element (i.e., a tag that is used for content addressing.) The CAM system also includes a tag latch configured to store a tag value for comparison with the tag values stored in the different CAM elements, a write data latch configured to store data which is to be written into one of the CAM elements, and a comparison output latch configured to store a comparison result.

Each CAM element includes a set of cells configured to store the tag value of a corresponding data entry. There is one cell for each bit in the tag. Each cell includes a memory cell that actually stores the data bit of the data entry and a comparator configured to compare the data bit to a corresponding bit of the tag stored in the tag latch. The output of each cell comparator is coupled to a CAM element comparator that determines whether any of the cells contain data bits that differ from the corresponding bits of the tag in the tag latch. The CAM element comparator provides an output signal indicating whether the data stored in the CAM element matches the tag in the tag latch. The output of the CAM element comparator for each of the CAM elements is then provided to the comparison output latch.

A tag is clocked into the tag latch at the rising edge of a first clock signal. As soon as the tag is clocked into the tag latch, signals at the outputs of the latch (the bits of the tag) begin to propagate through the comparison logic of the CAM. Thus, each bit of the data value in each CAM element is compared with the corresponding bit of the tag in the tag latch, then the results of these comparisons are combined to generate a match signal for each CAM element, and these signals become available to the comparison output latch. The signals from the individual CAM elements are latched into the comparison output latch at the rising edge of a second, comparison output latch clock signal. The rising edge of the comparison output latch clock signal lags the first clock signal by a period of time sufficient for the data to propagate from the tag latch to the comparison output latch.

When it is desired to write a new data entry to the CAM, the data entry is first clocked into the write data latch. The data entry is clocked into the write data latch by the same clock signal that clocks the tag into the tag latch. After the write data latch stabilizes and the new data entry is provided at the outputs of the latch, the new data entry is clocked into the memory cells of one of the CAM elements. The data is clocked into the memory cells by a third, write clock signal.

If a lookup command and a write command are concurrently issued, the corresponding actions described above are performed concurrently in the CAM. That is, these operations will be performed in the same cycle. In the present embodiment, the tag will be clocked into the tag latch and the new data entry will be clocked into the data latch at the same time. As soon as the tag is stored in the tag latch, the tag data begins to propagate through the comparison logic. The tag data may completely propagate through the comparison logic before the following pulse of the write clock occurs and causes the new data entry to be stored in the memory cells of the appropriate CAM element, although this is not necessarily the case. When the new data is stored in the corresponding CAM element, this data also begins to propagate through the comparison logic. It typically takes about the same amount of time for this data to propagate through the comparison logic as for the tag data to do so, although, again, this is not necessarily the case. In any event, the pulse of the comparison output latch clock signal should occur after the tag data propagates through the comparison logic, but before the data which has been newly stored in the CAM element propagates through the comparison logic. In this manner, the correct lookup information is clocked into the comparison output latch before the output of the comparison logic is corrupted by propagation of the newly stored data through this logic.

Referring to FIG. 1, a diagram illustrating the overall structure of a CAM system in accordance with one embodiment is shown. As depicted in this figure, system 100 includes a set of CAM memory elements 110–112 that are configured to store data, a tag latch (register) 120, a data latch 130, a decoder 140, a write address latch 150, an output latch 155, an address encoder 160 and a comparison output latch 170.

The data storage capability of the CAM system is provided by CAM memory elements 110–112. Although only three elements are depicted in FIG. 1, this embodiment has 64 CAM memory elements. If the CAM memory elements are numbered <0:63>, item 110 in FIG. 1 would correspond to element <0>, item 111 in the figure would correspond to element <1>, and item 112 would correspond to element <63>. In this particular embodiment, each of the 64 CAM memory elements has 32 memory cells, each of which is configured to store a single bit. Thus, the CAM memory in this embodiment is configured to store 64 32-bit data values.

Each of CAM memory elements 110–112 is coupled to tag latch 120. In this embodiment, tag latch 120 is configured to store a 32-bit tag value. CAM system 100 is configured to compare the 32-bit tag value stored in tag latch 120 to the 32-bit values stored in each of the 64 CAM memory elements. Each CAM memory element includes comparison logic (a comparator) that is configured to perform the comparison of the corresponding stored data value to the tag value in latch 120. This comparison logic will be described in more detail below.

The output of the comparison logic for each of the CAM memory elements is provided to comparison output latch 170. Comparison output latch 170 is configured to store an output bit corresponding to each of the CAM memory elements, for a total of 64 bits.

For each CAM memory element, the corresponding comparison output bit will be 1 if the data value in the memory element matches the tag value in the tag latch, and 0 if the data value in the memory element does not match the tag value. In this embodiment, no more than one of the CAM memory elements will have a data value that matches the tag value in tag latch 170. Accordingly, only one of the comparison output bits may be a 1. All of the other comparison output bits must be 0. This type of signal (in which only one of the signals is high, or 1, and all of the others are low, or 0) may be referred to as a "one-hot" signal.

In this particular embodiment, the tag value will always match a data value stored in one of the CAM memory elements. In alternative embodiments, it is possible that none of the CAM memory elements stores a data value that matches the tag value, in which case all of the comparison output bits would be 0. This would not, strictly speaking, be a "one-hot" signal.

The output of comparison output latch 170 is provided to decoder 160. Because only one of the comparison output bits stored in latch 170 will be high, there are only 64 possible values that may be stored in latch 170. For example, if the data value stored in CAM memory element 110 matches the tag value in tag latch 120, bits 0:63 in comparison output latch 170 will be "100 . . . 000". If the data value stored in memory element 111 matches the tag value, the bits in latch 170 will be "010 . . . 000", and so on. These 64 possible values can be represented by a 6-bit encoded value (because 26=64.) Encoder 160 performs the encoding of the 64-bit comparison output latch value and provides at its output a 6-bit encoded value indicating which of the 64 CAM memory elements stores the data value matching the tag in tag latch 120. This encoded value is then latched into output latch 155.

Just as each of CAM memory elements 110–112 is coupled to tag latch 120, each of these memory elements is also coupled to data latch 130. Data latch 130 is configured to store a 32-bit data value. When data is to be written to one of the CAM memory elements, the data value is stored in data latch 130 to stabilize the value so that it can be written into the memory element.

The selection of one of CAM memory elements 110–112 for the write operation is controlled by an address that is stored in write address latch 150. Write address latch 150 stores a 6-bit value that indicates to which of the 64 CAM memory elements the data in data latch 130 will be written. The 6-bit value output by write address latch 150 is decoded by decoder 140. That is, the 6-bit address value is converted to a 64-bit, "one-hot" value. Each of these 64 bits corresponds to one of the CAM memory elements. Whichever memory element receives the "1" bit from decoder 140 is the memory element to which the data in data latch 130 will be written.

As noted above, some embodiments may allow for the possibility that none of the CAM memory elements stores a data value that matches the tag value stored in the tag latch. In such embodiments, it may be necessary to reduce the number of CAM memory elements by one in order to be able to encode an address value in comparison output latch 170 in which each bit is 0.

Figure 2:
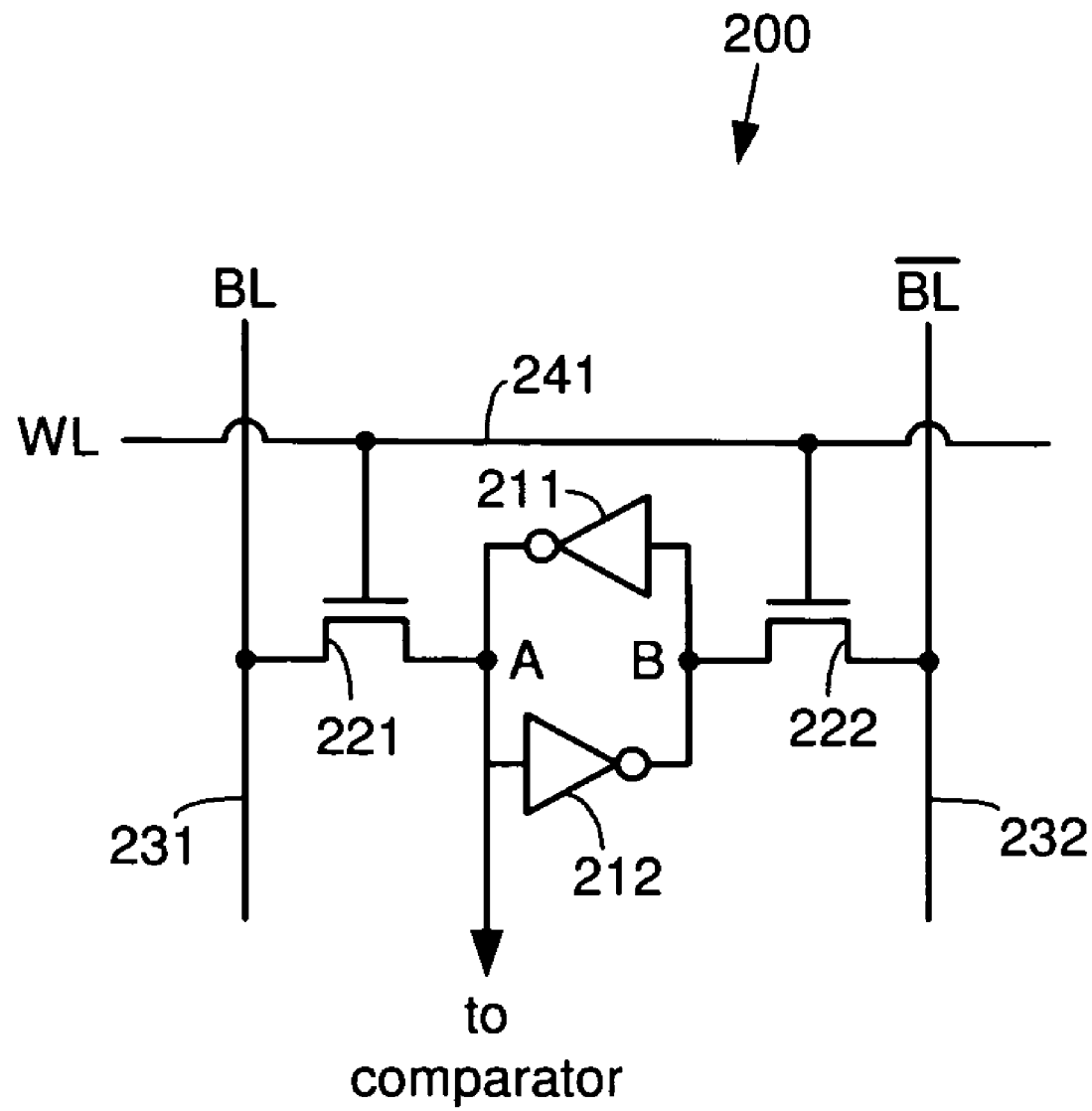
FIG. 2 is a diagram illustrating the structure of an individual cell within a CAM memory element in accordance with one embodiment.

Referring to FIG. 2, a diagram illustrating the structure of an individual cell within a CAM memory element in accordance with one embodiment is shown. In this embodiment, memory cell 200 is an SRAM cell. Memory cell 200 is configured to store a single bit (either a 0 or a 1.) Memory cell 200 consists of a pair of inverters, 211 and 212, and a pair of NMOS transistors, 221 and 222. Inverters 211 and 212 are coupled together, front-to-back, at nodes A and B. Transistor 221 is coupled between node A and a first bit line, 231. Transistor 222 is coupled between node B and a second bit line, 232. The gates of both transistor 221 and transistor 222 are coupled to a write signal line 241.

The value of the bit stored in memory cell 200 is the value at node A. Data is written into memory cell 200 by applying the value to be stored to bit line 231, and the inverse of this value to bit line 232. Write line 241, which is normally low, is then asserted (high) to switch on transistors 221 and 222. This allows node A to be pulled to the value on bit line 231, and node B to be pulled to the value on bit line 232. The signal on write line 241 is then deasserted (low) to switch transistors 221 and 222 off. The value that was on bit line 231 when write line 241 was asserted is therefore maintained at node A, while the opposite value is maintained at node B.

Data is read from memory cell 200 by precharging bit lines 231 and 232 to Vdd, then asserting the signal on line 241. Depending upon the value stored at node A, one of the two bit lines will be pulled low more strongly than the other. If memory cell 200 stores a 0, node A is at ground and will pull the voltage on bit line 231 down. Node B, the other hand, is at Vdd, and will not pull down the voltage on bit line 232. Thus, if the voltage on bit line 231 is pulled down below the voltage on bit line 232, memory cell 200 is read as a 0. If memory cell 200 stores a 1, node B will be at ground and will pull down the voltage on bit line 232. Consequently, if the voltage on bit line 232 is pulled down below the voltage on bit line 231, memory cell 200 is read as a 1.

In addition to the structure (and operation) just described, memory cell 200 has a signal line 251 which is coupled to node A. signal line 251 is also coupled to a comparator of the CAM memory element. The comparator provides an output signal that indicates whether each bit stored in the CAM memory element matches the corresponding bit of the tag stored in the tag latch. If all of the bits of the stored data value match the bits of the tag, the comparator provides a 1 at its output. If one or more of the bits of the data stored in the CAM memory element do not match the corresponding bits of the tag in the tag latch, the comparator provides a 0 at its output.

Figure 3:
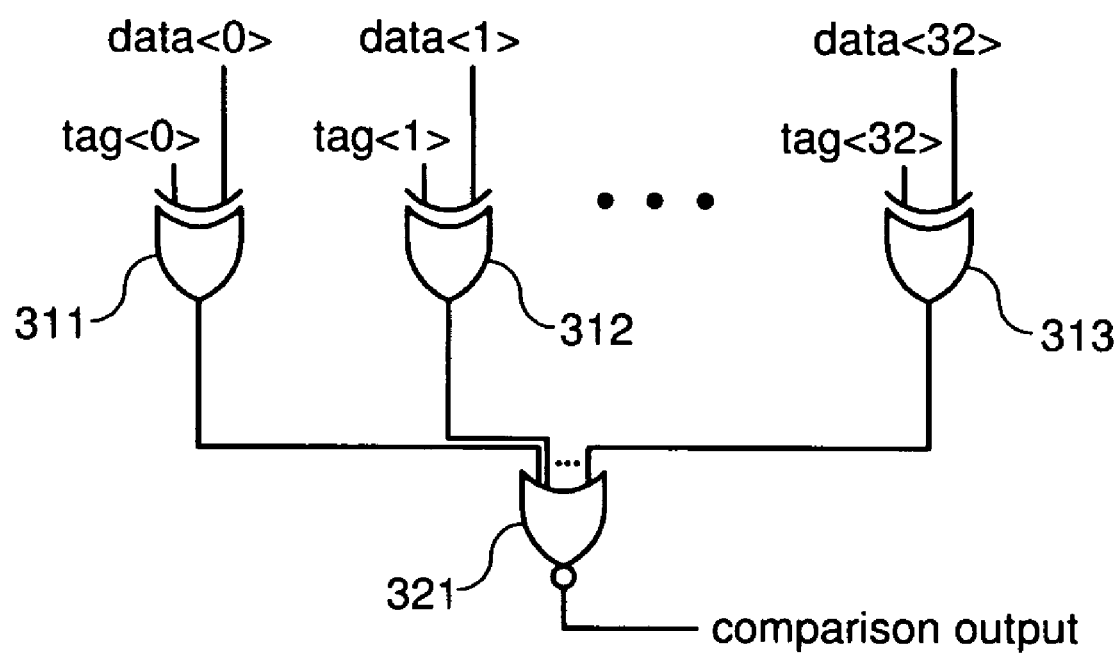
FIG. 3 is a diagram illustrating the structure of a comparator for a CAM memory element in accordance with one embodiment.

Referring to FIG. 3, a diagram illustrating the structure of a comparator for a CAM memory element in accordance with one embodiment is shown. In this embodiment, the comparator includes a series of exclusive OR (XOR) gates 311–313 and a NOR gate 321. Each of XOR gates 311–313 receives two signals: a tag bit signal; and a data bit signal. If these two signals are the same (i.e., if the data bit matches the corresponding tag bit,) the output of the XOR gate will be 0. If the signals are different (i.e., if there is a mismatch between the data bit and the corresponding tag bit,) the output of the XOR gate will be 1. Thus, if all of the bits of the data value stored in the CAM memory element are identical to the corresponding bits of the tag value stored in the tag latch, the outputs of all of XOR gates 311–313 will be 0. Otherwise, the outputs of one or more of the XOR gates will be 1.

The output of each of XOR gates 311–313 is provided as an input to NOR gate 321. NOR gate 321 provides an output signal (identified as the comparison output in FIG. 3) that is 1 if all of the inputs received from XOR gates 311–313 are 0, and is 0 if any one (or more) of the inputs received from the XOR gates is 1. Thus, if all of the bits of the data value stored in the CAM memory element are identical to the corresponding bits of the tag value stored in the tag latch, the comparison output provided by NOR gate 321 will be 1, indicating a match between the data value and the tag value. If any of the bits of the data value in the CAM memory element do not match the corresponding bits of the tag value, the output of NOR gate 321 will be 0, indicating that the data value and the tag value do not match.

It should be noted that, while NOR gate 321 is depicted in FIG. 3 as a single logic gate, it may be impractical to manufacture a single logic gate having a large number (e.g., 32) of inputs. As a result, it may be desirable to provide a logic circuit in place of NOR gate 321 that actually has multiple physical logic gates, but performs the same logic function as the 32-input NOR gate.

A comparator of the type described in connection with FIG. 3 is implemented in each of the CAM memory elements. Because, in the embodiment of FIG. 1, there are 64 CAM memory elements, there will be 64 comparison outputs corresponding to these elements. As shown in FIG. 1, the 64 bits of the comparison outputs are provided to comparison output latch 170. The 64 bits that are present at the inputs to latch 170 upon the occurrence of a rising edge at the clock input to the latch are stored in the latch and provided that the outputs of the latch. These outputs are provided as inputs to encoder 160. Encoder 160 converts the 64-bit wide, one-hot signal from comparison output latch 170 to a 6-bit wide encoded address value indicating which one of the CAM memory elements stores a data value matching the tag value in tag latch 120.

Conventional CAM systems typically have a similar structure to that described above in connection with FIGS. 1–3. Conventional systems, however, normally do not include comparison output latch 170. Conventional CAM systems simply assume that the data values in the CAM memory elements will not change during the lookup operation. Since the data values are assumed not to change, the outputs from the comparison logic in each CAM memory element should not change during the lookup operation. Consequently, there is no need to latch these outputs prior to providing them to encoder 160. If, however, it cannot be assumed that the data values in the CAM memory elements will not change during the lookup operation, it is necessary to latch the comparison outputs at some time after the initial data (upon which the lookup is performed) has propagated through the comparison logic, but before subsequently modified (overwritten) data propagates through the comparison logic and potentially changes the comparison outputs. This will be explained in more detail below in regard to FIGS. 4–7.

Figure 4B:
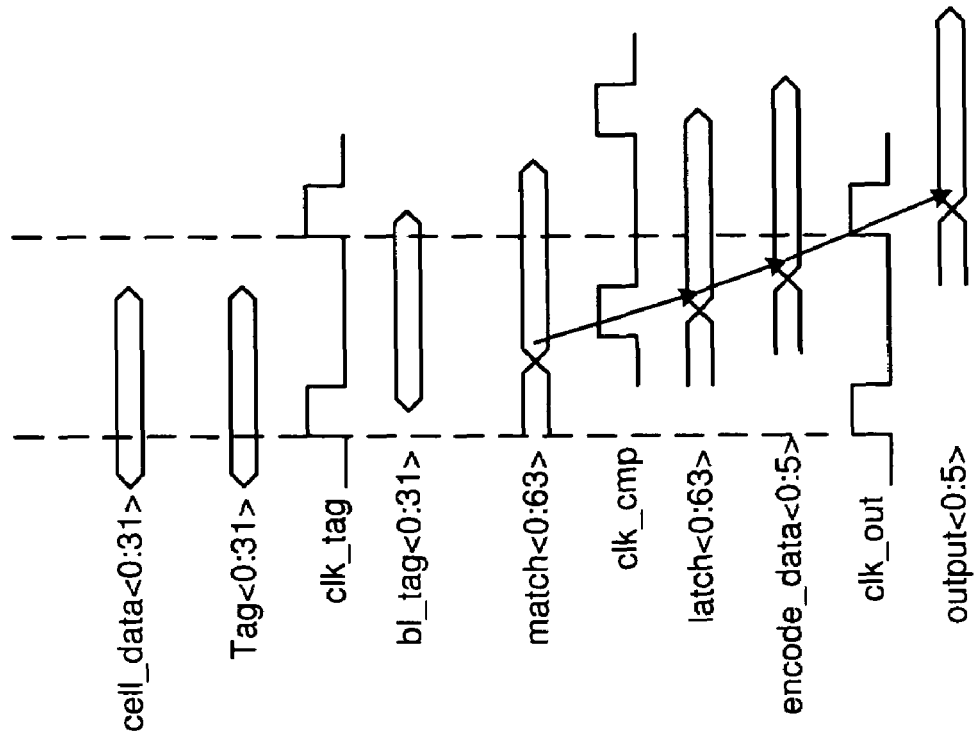
FIGS. 4A and 4B are a pair of timing diagrams illustrating the functioning of two CAM systems during a lookup operation.
Figure 4A:
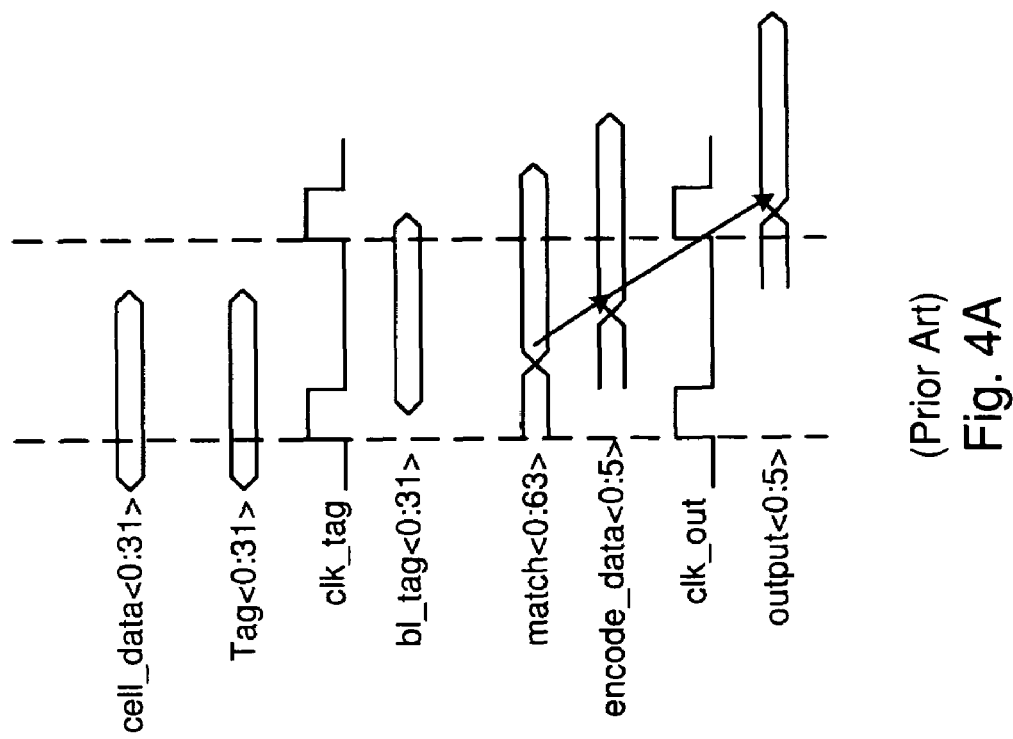

Referring to FIGS. 4A and 4B, a pair of timing diagrams illustrating the functioning of two CAM systems during a lookup operation is shown. FIG. 4A illustrates the function of a prior art CAM memory system, while FIG. 4B illustrates the function of a CAM system in accordance with one embodiment of the invention.

The two vertical dashed lines in each figure indicate the beginning and end of a cycle during which the lookup operation is performed. The lookup operation is depicted and described in relation to a single one of the CAM memory cells in the respective systems, but is applicable to all of the memory cells.

Referring to FIG. 4A, it can be seen that, before the lookup operation is initiated, there is a data value (cell_data<0:31>) already stored in the CAM memory cell. Similarly there is a tag value (Tag<0:31>) available at the inputs to the tag latch. The lookup operation begins with the rising edge of the clk_tag clock signal. The clk_tag signal is provided to the clock input of the tag latch, so the rising edge causes the tag value to be clocked into the tag latch. The data in the tag latch is identified in the figure as bl_tag<0:31>.

As soon as the tag value appears at the outputs of the tag latch, these values begin to propagate through the comparison logic. Because the data value (cell_data<0:31>) was already present in the CAM memory cell, this data propagates through the comparison logic as well. It takes some period of time for the stored data and the tag data to propagate through the comparison logic. After this period of time, the comparison output data is available at the output of the comparison logic. The comparison output data is identified in the figure as match<0:64>, corresponding to the 64-bit outputs of the 64 CAM memory elements.

At this point, in the conventional CAM system of FIG. 4A, the 64-bit wide comparison output data is provided directly to the encoder. The encoder encodes the 64-bit wide, one-hot signal to a 6-bit wide signal (a 6-bit address corresponding to the CAM memory element in which a data value matching the tag value is stored.) This 6-bit wide signal is then clocked (at the rising edge of an output clock signal, clk_out) into a latch that follows the encoder.

In the invention, however, rather than providing the outputs of the comparison logic directly to the encoder, the outputs of the comparison logic are input to a latch. The 64-bit wide comparison output data (match<0:64>) is clocked into a comparison output latch. The output of this latch is then provided to the encoder. The encoder then produces a 6-bit address from the output of the latch.

Referring to FIG. 4B, the lookup operation in the CAM system according to the exemplary embodiment of the invention is very similar to the lookup operation of the conventional system up to the point at which the comparison output data is produced by the comparison logic. At this point, however, rather than simply providing the comparison output data to the encoder, this data is provided to comparison output latch 170. The data is clocked into comparison output latch 170 at the rising edge of a clk_cmp signal. The output of comparison output latch 170 (latch<0:63>) is then provided to encoder 160, which converts the 64-bit wide, one-hot signal to a 6-bit wide address signal corresponding to the CAM memory element in which the data value matching the tag value is stored. This 6-bit address is then clocked into an output latch at the rising edge of a clk_out signal.

Figure 5:
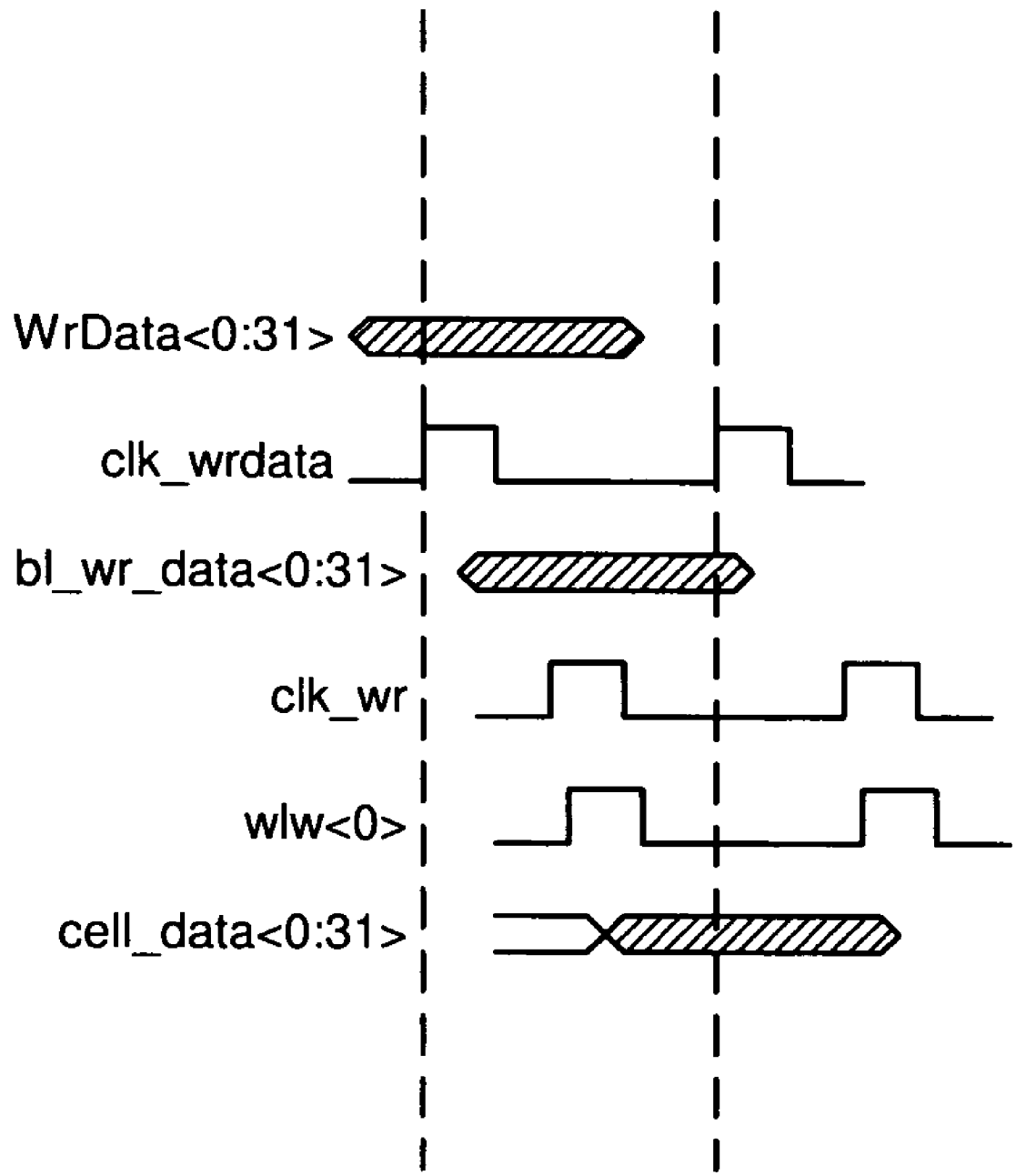
FIG. 5 is a diagram illustrating the functioning of a CAM memory system during a write operation in accordance with one embodiment.

Referring to FIG. 5, a diagram illustrating the functioning of a CAM memory system during a write operation in accordance with one embodiment is shown. It should be noted that, because the write operation proceeds in the same manner in both conventional CAM systems and the CAM system according to an exemplary embodiment of the invention, only a single timing diagram is shown, rather than separate diagrams as in FIGS. 4A and 4B.

The two vertical dashed lines in FIG. 5 indicate the beginning and end of a cycle during which a write operation is performed. The write operation is depicted and described in relation to a single CAM memory element. The write operation causes data to be written to only a single CAM memory element. This element is selected by the write address that is latched into write address latch 150, and the resulting one-hot signal produced by decoder 140.

Referring to FIG. 5, the data to be written into one of the CAM memory elements is available at the inputs of data latch 130 before the write operation is initiated. At the rising edge of a clock signal (clk_wrdata,) the data (WrData<0:31>) is clocked into data latch 130. Shortly thereafter, the data appears at the outputs of data latch 130 (identified as bl_wr_data<0:31> in the figure.) After the data has become available at the outputs of the data latch, a signal (clk_wr) is asserted to switch on the transistors of the memory cell, coupling the cell to the bit lines that carry the data. (The signal wlw<0> is the result of AND'ing clk_wr with a signal selecting element <0>, and therefore lags slightly behind clk_wr.) The memory cell is thereby pulled to the value of the data bit, and the data is stored in the cell (as indicated by cell_data<0:31> in the figure.) When the clk_wr signal is deasserted, the transistors are switched off, and the data bit is retained in the memory cell.

It should be noted that, as described above, the elements of the CAM memory may be configured to be read, as well as written. This read operation is distinct from the lookup operation which is described in detail herein. The reading of the CAM memory elements may involve the use of latches and various other components that are not shown explicitly in the figures of the application. These components have been omitted for the sake of clarity in the description of the present embodiment, but may nevertheless be present in this and alternative embodiments.

Figure 6:
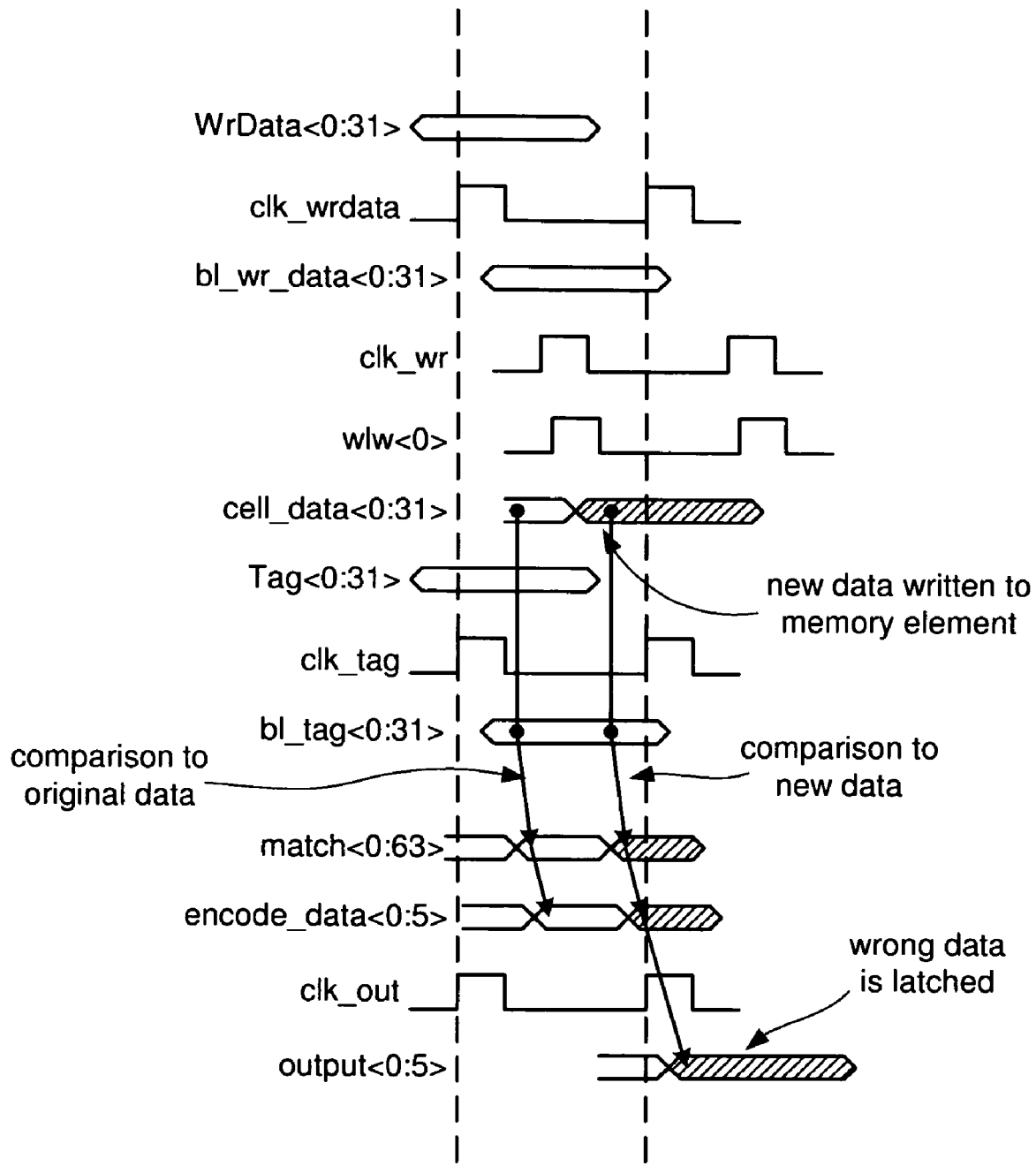
FIG. 6 is a timing diagram illustrating the functioning of a conventional CAM memory system when a lookup operation is performed concurrently with a write operation.

As noted above, conventional CAM memory systems may experience problems when a lookup operation is performed concurrently with a write operation. This is illustrated in FIG. 6. FIG. 6 is a timing diagram illustrating the functioning of a conventional CAM memory system when a lookup operation is performed concurrently with a write operation. The lookup operation is intended to be based upon the data that is stored in the CAM memory when the lookup and write operations are initiated.

The write operation of the conventional system proceeds in the same manner as described above in relation to FIGS. 4A and 5. The concurrent lookup operation proceeds in almost the same manner as shown in FIG. 4A except that the data stored in the CAM memory element (cell_data<0:31>) changes midway through the cycle as a result of the write operation.

Because the data in the CAM memory element changes, there is a first portion of the lookup operation in which the tag value in the tag latch is compared to the data value that was initially stored in the CAM memory element, and a second portion of the lookup operation in which the tag value is compared to the data value that is newly written into the CAM memory element. As a result, the comparison result provided to the encoder is initially based on the data that was stored in the CAM memory element at the beginning of the cycle, and then changes, based on the newly written data. Because the output of the encoder is latched by the output clock (clk_out) at the end of the cycle when the comparison is based on the newly written data rather than the original data, the lookup result (output<0:5>) is incorrect. That is, the lookup result is based upon the newly written data instead of the data that was stored in the CAM memory element when the lookup operation was initiated.

Figure 7:
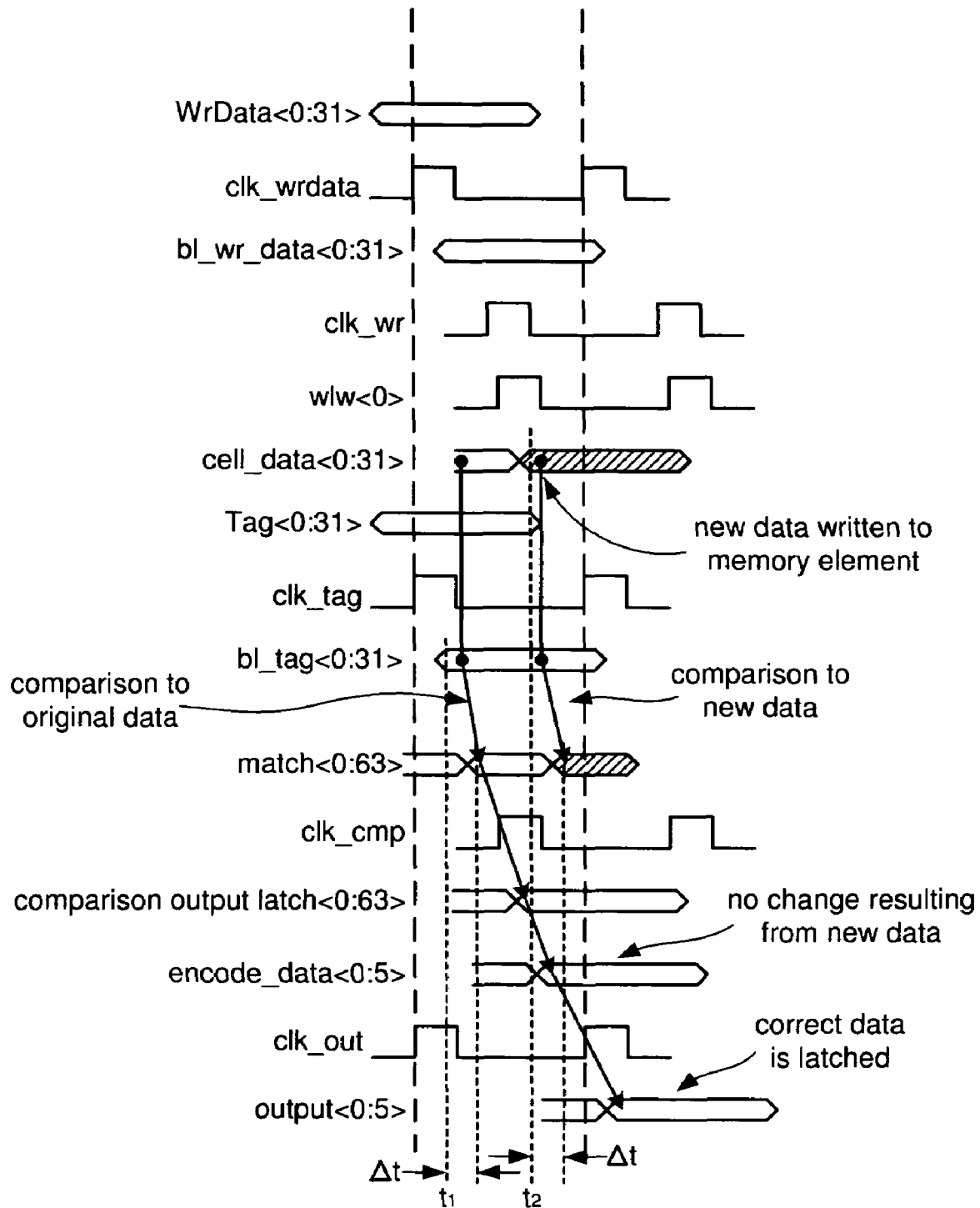
FIG. 7 is a timing diagram illustrating the functioning of a CAM memory system in accordance with one embodiment.

Referring to FIG. 7, a timing diagram illustrating the functioning of a CAM memory system in accordance with one embodiment is shown. As illustrated in this figure, the lookup operation is again based initially on the data value which is present in the memory element at the beginning of the cycle. This data value and the tag value propagate through the comparison logic to generate the desired comparison output (as match<0:63>.) Rather than being provided directly to the encoder, however, the comparison output is clocked into the comparison output latch by the rising edge of the clk_cmp signal. The output of this latch is then provided to the encoder, which generates the 6-bit address that is clocked into the output latch and provided as output<0:5>.

As in the conventional CAM memory system, the write operation causes the data in the memory element (cell_data<0:31>) to change midway through the cycle. When the data value in the memory element changes, the new data value propagate through the comparison logic and produces a second comparison output value (match<0:63>.) This change, however, does not affect the output of the comparison output latch, which stores the result of the first, desired comparison (since this result was clocked into the latch by clk_cmp before the data in the memory element was changed.) The result of the first comparison and therefore continues to be provided to the encoder, which in turn continues to provide the correct encoded 6-bit address to the output latch. Consequently, when the rising edge of clk_out occurs, the desired comparison result is stored in the output latch.

It should be noted that the rising edge of the clk_cmp signal must occur before the changes to cell_data<0:31> propagate through the comparison logic. It can be seen in FIG. 7 that the data in the memory element (cell_data<0:31>) and the tag value in the tag latch are both available at about time t1. If it takes an amount of time t for this data to propagate through the comparison logic, the desired comparison result becomes available at the outputs of the comparison logic at approximately time t1+t. If the new data is written to the memory element (cell_data<0:31>) at about time t2, the outputs of the comparison logic will change from the desired value to the wrong value at approximately time t2+t. The rising edge of clk_cmp should therefore occur between approximately t1+t and t2+t.

In one embodiment, signal clk_cmp is synchronized with data write clock signal clk_wr. That is, the rising edges of these two clock signals occur at the same time. Because the data that is newly written into the CAM element does not propagate to the outputs of the comparison logic until at least t later, the outputs that are clocked into the comparison output latch will not be changed by the newly written data. In another embodiment, the CAM system may be designed so that the rising edge of clk_cmp falls midway between t1+t and t2+t.

It should be noted that the embodiment which is described in detail above is exemplary and that many alternative embodiments are possible. For example, while the foregoing embodiment latches the outputs of the comparison logic so that these outputs can be provided (at the outputs of comparison output latch 170) to encoder 160, they outputs of the comparison logic could be latched for another purpose. In other words, the outputs of comparison output latch 170 could be provided to a logic circuit other than encoder 160. Further, even if the outputs of comparison output latch 170 are provided to an encoder, the structure of the encoder could vary from one embodiment to another. For instance, the encoder could comprise either a static logic circuit or a dynamic logic circuit.

In another alternative embodiment, the comparison logic described above could be replaced by alternative structures. The comparison logic described in connection with the foregoing embodiment (particularly in relation to FIG. 3) employs a static logic circuit having a plurality of XOR gates coupled to a NOR gate. In an alternative embodiment, the comparison logic could be structured as a dynamic circuit, or as a static circuit having different logic components.

Figure 8:
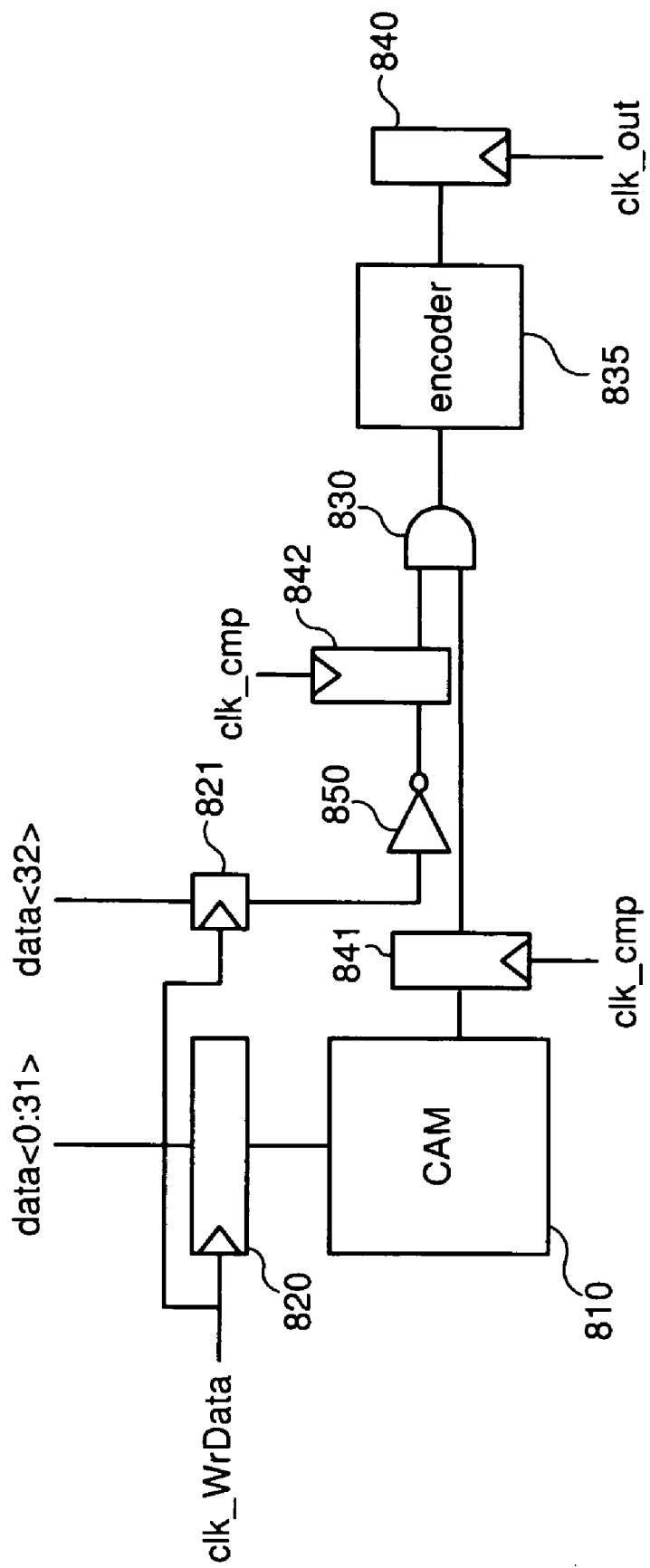
FIG. 8 is a diagram illustrating a portion of the structure of an exemplary CAM memory that implements an invalidate bit.

Alternative embodiments can also include additional features that are combined with the features described above. For example, a CAM memory system in accordance with one alternative embodiment could be configured to take into account an invalidate bit that is provided with data that is to be written into the CAM. In some cases, it may be desirable to invalidate any lookup operation that might be performed concurrently with a particular write operation. In such cases, this could be indicated by setting the invalidate bit and causing any concurrent lookup operations to be invalidated based upon this bit. Referring to FIG. 8, a diagram illustrating the structure of an exemplary CAM memory that implements an invalidate bit is shown. Only the components of the system that are affected by the invalidate bit mechanism are shown in the figure.

In the embodiment of FIG. 8, the comparison logic outputs resulting from a lookup operation are provided to a comparison output latch 841. The output of latch 841 is then provided to AND gate 830. AND gate 830 is actually a 64-bit wide gate (or 64 1-bit gates) that performs a bit-wise AND'ing of each of the 64 comparison outputs with the inverse of an invalidate bit.

When data is to be written into the CAM memory, the data is provided as a 32-bit value and a single invalidate bit, which are clocked into data latch 820, and latch 821, respectively. If no write operation is being performed, the output of latch 821 is 0. The invalidate bit initially stored in latch 821 is inverted by inverter 850 and is then clocked into latch 842 by the clk_cmp signal. The inverted invalidate bit is then AND ed with the a 64-bit wide value in comparison output latch 841. The result is provided to encoder 835, and the encoded value produced by the encoder is clocked into output latch 840 by clk_out.

When a lookup operation is performed and either there is no concurrent write operation or the invalidate bit for the concurrent write operation is 0, the comparison logic outputs are simply passed through AND gate 830. A match between the tag value and the value and one of the CAM elements is thereby indicated in the same manner as described in the foregoing embodiments. If the lookup operation is performed concurrently with a write operation for which the invalidate bit is set to 1, the output of AND gate 830 is 0, regardless of the comparison logic outputs. The CAM system therefore indicates a mismatch (no data value in the CAM elements matching the tag value,) whether there is actually a matching data value or not.

Figure 9:
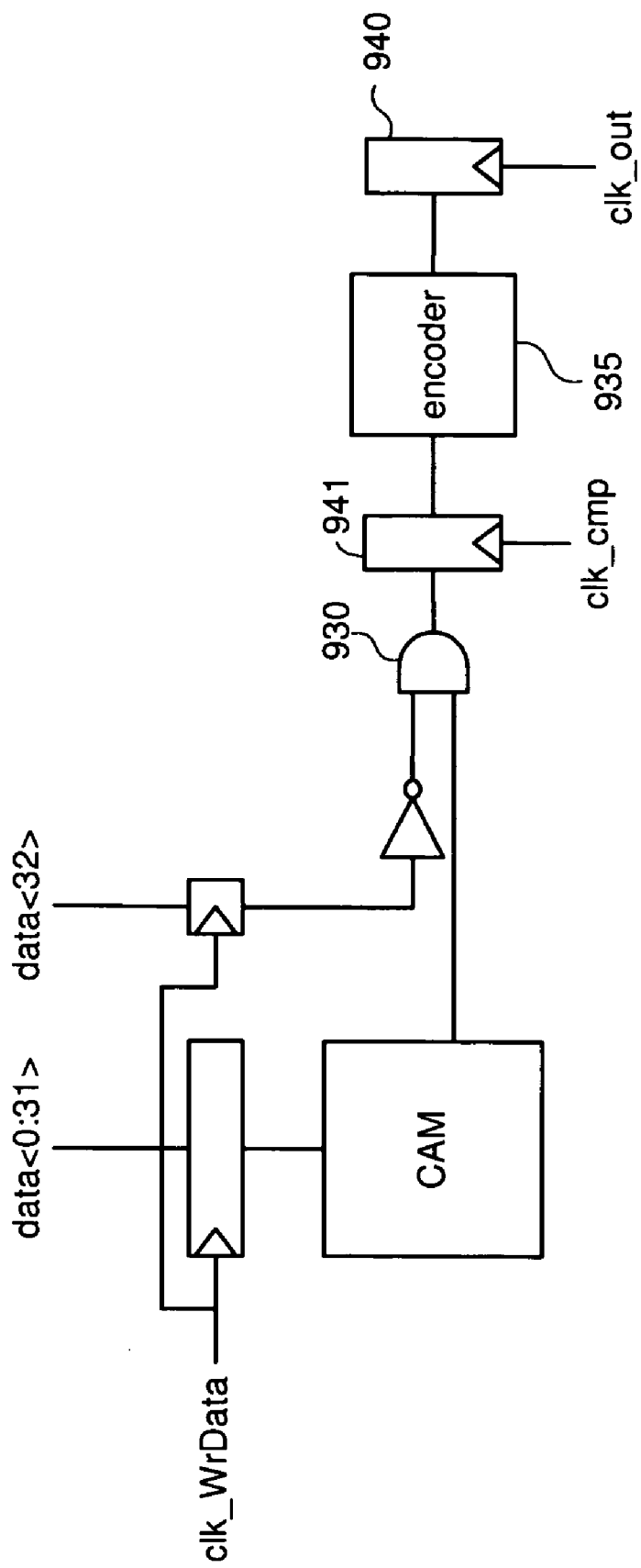
FIG. 9 is a diagram illustrating a portion of the structure of an alternative CAM memory that implements an invalidate bit.

An alternative embodiment that implements an invalidate bit mechanism is illustrated in FIG. 9. In FIG. 9, the invalidate bit mechanism is similar to the mechanism of FIG. 8, with minor modifications. As in the embodiment of FIG. 8, the mechanism of FIG. 9 includes an encoder 935 between AND gate 930 and output latch 940. Rather than having latches on the inputs of AND gate 930, however, a single latch 941 is positioned between AND gate 930 and encoder 935. Latch 941 holds the bit-invalidated output of the comparison logic for encoding by encoder 935.

While the disclosure of the present application discusses the invention in the context of multi-processor computing systems, it should be noted that the invention is more widely applicable and can be used in a variety of other contexts. Consequently, the disclosure should not be considered as limiting the invention to the field of multimedia game systems.

Those of skill in the art will understand that information and signals may be represented using any of a variety of different technologies and techniques. For example, data, instructions, commands, information, signals, bits, and the like that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs), application specific integrated circuits (ASICs), field programmable gate arrays (FPGAs) or other programmable logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
    an array of content addressable memory (CAM) elements configured to store corresponding data entries;
    comparison logic coupled to each of the CAM elements and configured to compare the data entries to a tag value and generate corresponding comparison output values; and
    a comparison output latch coupled to the comparison logic and configured to latch the comparison output values;
    wherein when a lookup operation on the CAM elements is performed concurrently with a write operation to one of the CAM elements, the comparison output latch is configured to latch the comparison output values for the lookup operation before data written by the write operation propagates through the comparison logic.

2. The system of claim 1, further comprising an encoder coupled to the comparison output latch and configured to receive the comparison output values from the comparison output latch.

3. The system of claim 2, wherein the encoder comprises a static logic circuit.

4. The system of claim 1, wherein the comparison logic comprises a static logic circuit.

5. The system of claim 1, further comprising invalidate logic configured to determine whether an invalidate bit associated with a data value to be written into one of the CAM elements is set and to invalidate results of a lookup operation performed concurrently with a write operation to write the data value into one of the CAM elements when the invalidate bit is set.

6. The system of claim 5, wherein the invalidate logic is configured to set all of the comparison output values for the lookup operation to 0 when the invalidate bit is set.

7. The system of claim 6, wherein the invalidate logic comprises one or more AND gates configured to AND the comparison output values with the inverse of the invalidate bit.

8. The system of claim 1, further comprising a read circuit coupled to the CAM elements, wherein the read circuit is configured to read data values from one or more of the CAM elements.

9. The system of claim 1, further comprising a write data latch coupled to the CAM elements; wherein a data value to be written into one of the CAM elements is clocked into the write data latch by a first clock signal; wherein the data value is written from the write data latch into one of the CAM elements when a pulse of a second clock signal occurs; wherein the comparison output values are clocked into the comparison output latch by a third clock signal; and wherein the second clock signal is synchronized with the third clock signal.

10. The system of claim 9, further comprising a tag latch coupled to the CAM elements and configured to store the tag value; wherein the tag value is clocked into the tag latch simultaneously with the data value being clocked into the write data latch.

11. The system of claim 1:
    further comprising a write data latch coupled to the CAM elements;
    wherein a data value to be written into one of the CAM elements is clocked into the write data latch by a first clock signal;
    wherein the data value is written from the write data latch into one of the CAM elements when a pulse of a second clock signal occurs;
    wherein the comparison output values are clocked into the comparison output latch by a third clock signal; and
    wherein a pulse of the third clock signal occurs during an interval beginning at a pulse of the first clock signal plus 1, and ending at the pulse of the second clock signal plus 2, where 1 is a time required for tag data to propagate through a tag latch and the comparison logic and 2 is a time required for new CAM element data to propagate through the comparison logic.

12. A method comprising:
    comparing data values stored in an array of content addressable memory (CAM) elements to a tag value;
    generating comparison output values, wherein each of the comparison output values is based on comparison of a data value in a single one of the CAM elements to the tag value; and
    latching the comparison output values;
    wherein when a lookup operation on the CAM elements is performed concurrently with a write operation to one of the CAM elements, the comparison output values are latched before changes in the data values propagate to the comparison output values.

13. The method of claim 12, further comprising providing encoding the latched comparison output values to provide an encoded lookup address.

14. The method of claim 13, wherein encoding the latched comparison output values comprises encoding the latched comparison output values using a static encoding logic circuit.

15. The method of claim 12, wherein generating the comparison output values comprises generating the comparison output values using a static comparison logic circuit.

16. The method of claim 12, further comprising determining whether an invalidate bit associated with a data value to be written into one of the CAM elements is set and, when the invalidate bit is set, invalidating results of a lookup operation which is performed concurrently with a write operation to write the data value into one of the CAM elements.

17. The method of claim 16, wherein invalidating the results of the lookup operation comprises setting the comparison output value for each CAM element to 0 when the invalidate bit is set.

18. The method of claim 17, wherein invalidating the results of the lookup operation comprises AND'ing each of the comparison output values with the inverse of the invalidate bit.

19. The method of claim 12, further comprising clocking a data value to be written into one of the CAM elements into a write data latch using a first clock signal, writing the data value from the write data latch into one of the CAM elements using a second clock signal, and clocking the comparison output values into the comparison output latch using a third clock signal, and wherein the second clock signal is synchronized with the third clock signal.

20. The method of claim 19, further comprising clocking a tag value into a tag latch simultaneously with clocking the data value into the write data latch.

21. The method of claim 12:
further comprising clocking a data value to be written into one of the CAM elements into a write data latch using a first clock signal,
writing the data value from the write data latch into one of the CAM elements using a second clock signal, and
clocking the comparison output values into the comparison output latch using a third clock signal,
wherein a pulse of the third clock signal occurs during an interval beginning at a pulse of the first clock signal plus 1, and ending at the pulse of the second clock signal plus 2, where 1 is a time required for tag data to propagate through a tag latch and the comparison logic and 2 is a time required for new CAM element data to propagate through the comparison logic.

* * * * *